(12) United States Patent
Zhang et al.

(10) Patent No.: US 9,536,793 B1
(45) Date of Patent: Jan. 3, 2017

(54) SELF-ALIGNED GATE-FIRST VFETS USING A GATE SPACER RECESS

(71) Applicant: GLOBALFOUNDRIES Inc., Grand Cayman (KY)

(72) Inventors: John H. Zhang, Altamont, NY (US); Kwan-Yong Lim, Niskayuna, NY (US); Steven John Bentley, Menands, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/135,917

(22) Filed: Apr. 22, 2016

(51) Int. Cl.
  *H01L 29/786* (2006.01)
  *H01L 21/8238* (2006.01)

(52) U.S. Cl.
  CPC ........... *H01L 21/823828* (2013.01); *H01L 21/823807* (2013.01); *H01L 21/823814* (2013.01); *H01L 21/823864* (2013.01); *H01L 21/823871* (2013.01); *H01L 21/823885* (2013.01)

(58) Field of Classification Search
  CPC ........ H01L 29/78; H01L 29/786; H01L 29/66; H01L 21/336; H01L 21/762
  See application file for complete search history.

(56) References Cited

U.S. PATENT DOCUMENTS

| | | | |
|---|---|---|---|
| 7,148,541 B2 * | 12/2006 | Park | H01L 29/66795 257/347 |
| 9,087,870 B2 * | 7/2015 | Tong | H01L 21/76224 |
| 2005/0199920 A1 * | 9/2005 | Lee | H01L 29/7851 257/288 |
| 2007/0090443 A1 * | 4/2007 | Choi | H01L 21/84 257/314 |
| 2007/0287255 A1 * | 12/2007 | Doyle | H01L 29/66795 438/279 |
| 2014/0227858 A1 * | 8/2014 | Shen | H01L 21/76224 438/430 |
| 2015/0044829 A1 * | 2/2015 | Kim | H01L 21/823807 438/199 |
| 2015/0187943 A1 * | 7/2015 | Lee | H01L 29/66636 257/192 |
| 2015/0380556 A1 * | 12/2015 | Ching | H01L 29/7849 257/351 |
| 2016/0093726 A1 * | 3/2016 | Ching | H01L 29/785 257/192 |

* cited by examiner

*Primary Examiner* — Errol Fernandes
(74) *Attorney, Agent, or Firm* — Ditthavong & Steiner, P.C.

(57) ABSTRACT

Methods for self-aligned gate-first VFETs using gate-spacer recess and the resulting devices are disclosed. Embodiments include providing a substrate including adjacent transistor regions; forming adjacent and spaced fin-structures each including hardmask over a fin and over a different transistor region; forming a gate-dielectric and metal-spacer consecutively on each side of each fin-structure; forming a liner on all exposed surfaces of the hardmask, gate-dielectrics, and metal-spacers and the substrate; forming an ILD filling spaces between the fin-structures and coplanar with an upper surface of the liner; removing the liner over the fin-structures; removing the hardmask and recessing the liner, the gate-dielectrics and metal-spacers of each fin-structure creating cavities in the ILD; forming a low-k spacer on sidewalls of and over the metal-spacers and liners in each cavity; forming a top S/D structure over the gate-dielectric and fin in each cavity; and forming a top S/D contact over each top S/D structure.

13 Claims, 11 Drawing Sheets

US 9,536,793 B1

SELF-ALIGNED GATE-FIRST VFETS USING A GATE SPACER RECESS

TECHNICAL FIELD

The present disclosure relates generally to designing and fabricating integrated circuit (IC) devices. The present disclosure is particularly applicable to self-aligned gate first processes utilized in forming vertical field-effect transistors (VFETs).

BACKGROUND

With advancements in IC scaling with smaller technology nodes, the VFET transistor architecture may be utilized for the 5 nm technology node and beyond. However, forming a self-aligned replacement metal gate in a VFET transistor is challenging since the gate structure becomes buried under top source/drain (S/D) structures. The current process flow may not be able to meet the initial VFET pitch measurements of less than 27 nm. Additionally, the current processes (e.g. chemical mechanical polishing (CMP)) for removing materials from gate structures with multiple stop materials may be inefficient and inaccurate for the VFET architecture.

Therefore, a need exists for methodology enabling production of self-aligned gate-first VFETs and the resulting devices.

SUMMARY

An aspect of the present disclosure is a method for producing self-aligned gate-first VFETs using a gate-spacer recess.

Another aspect of the present disclosure is a device including self-aligned gate-first VFETs with a gate-spacer recess.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a substrate including adjacent transistor regions; forming adjacent fin structures, spaced from each other, each over a different transistor region and including a fin and a hardmask over the fin; forming a gate dielectric and metal spacer consecutively on each side of each fin structure; forming a liner on exposed surfaces of the hardmask, the gate dielectric and metal spacer of each fin structure, and the substrate; forming an interlayer dielectric (ILD) filling spaces between the fin structures and coplanar with an upper surface of the liner over each fin structure; removing the liner over the fin structures; removing the hardmask and recessing the liners, the gate dielectrics and metal spacers of each fin structure creating cavities in the ILD; forming a low-k spacer on sidewalls of and over the metal spacers and liners in each cavity; forming a top source/drain (S/D) structure over the gate dielectric and fin in each cavity; and forming a top S/D contact over each top S/D structure.

One aspect includes forming each fin structure over a bottom S/D region in a corresponding transistor region.

Another aspect includes forming each fin in contact with the bottom S/D region of the corresponding transistor region.

A further aspect includes forming each top S/D structure by epitaxially growing a semiconductor material.

One aspect includes implanting each top S/D structure with a dopant based on a type of transistor region associated with the corresponding fin.

An additional aspect includes forming the liner, gate dielectric, and metal spacer on each side of each fin on low-k spacers over the transistor regions.

Another aspect includes forming the ILD over the liner in addition to between the fin structures; and removing the ILD down to an upper surface of the liner by chemical-mechanical-polishing (CMP) prior to removing the liner over the fin structures.

In one aspect, an upper surface of the liner and each metal spacer is lower than an upper surface of each gate dielectric in each cavity subsequent to recessing the liner, metal spacers, and gate dielectrics.

Another aspect of the present disclosure includes a device including: a substrate including adjacent transistor regions; adjacent fins spaced from each other, each over a different transistor region; a gate dielectric, a metal spacer, and a liner consecutively formed on each side of each fin, the liner also formed on exposed surfaces of the substrate between adjacent fins; a top S/D structure over each fin and adjacent gate dielectrics; a top S/D contact over each top S/D structure; a low-k spacer on each side of each top S/D structure and S/D contact; and ILD filling spaces between adjacent liners and low-k spacers.

In one aspect, each fin structure is formed over a bottom S/D region in a corresponding transistor region.

In a further aspect, each fin is formed in contact with the bottom S/D region of the corresponding transistor region.

In an additional aspect, each top S/D structure is formed of epitaxially grown semiconductor material.

In one aspect, each top S/D structure is implanted with a dopant based on a type of transistor region associated with the corresponding fin.

In a further aspect, the liner, gate dielectrics, and metal spacers are formed on low-k spacers over the transistor regions.

In one aspect, a top surface of the liner and the metal spacer on each side of each fin is lower than a top surface of each gate dielectric.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in a block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of VFET gate structures being buried under top S/D structures and ILD CMP having multiple stop layers attendant upon forming self-aligned gate-first VFETs, particularly with increasingly smaller spacing. The present disclosure addresses and solves such problems, for instance, by, inter alia, forming fully self-aligned gate-first process using a metal gate spacer recess.

Methodology in accordance with embodiments of the present disclosure includes providing a substrate including adjacent transistor regions. Adjacent fin structures are formed, spaced from each other, each over a different transistor region and including a fin and a hardmask over the fin. A gate dielectric and metal spacer are then consecutively formed on each side of each fin structure followed by a liner on exposed surfaces of the hardmask, the gate dielectric and metal spacer of each fin structure, and the substrate. An ILD fills spaces between the fin structures and is formed to be coplanar with an upper surface of the liner. The liner and hardmask are then removed over the fin structures, and the liners, the gate dielectrics and metal spacers of each fin structure are recessed creating cavities in the ILD. A low-k spacer is formed on sidewalls of and over the metal spacers and liners in each cavity. Last a top S/D structure is formed over the gate dielectric and fin in each cavity with a top S/D contact over each top S/D structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
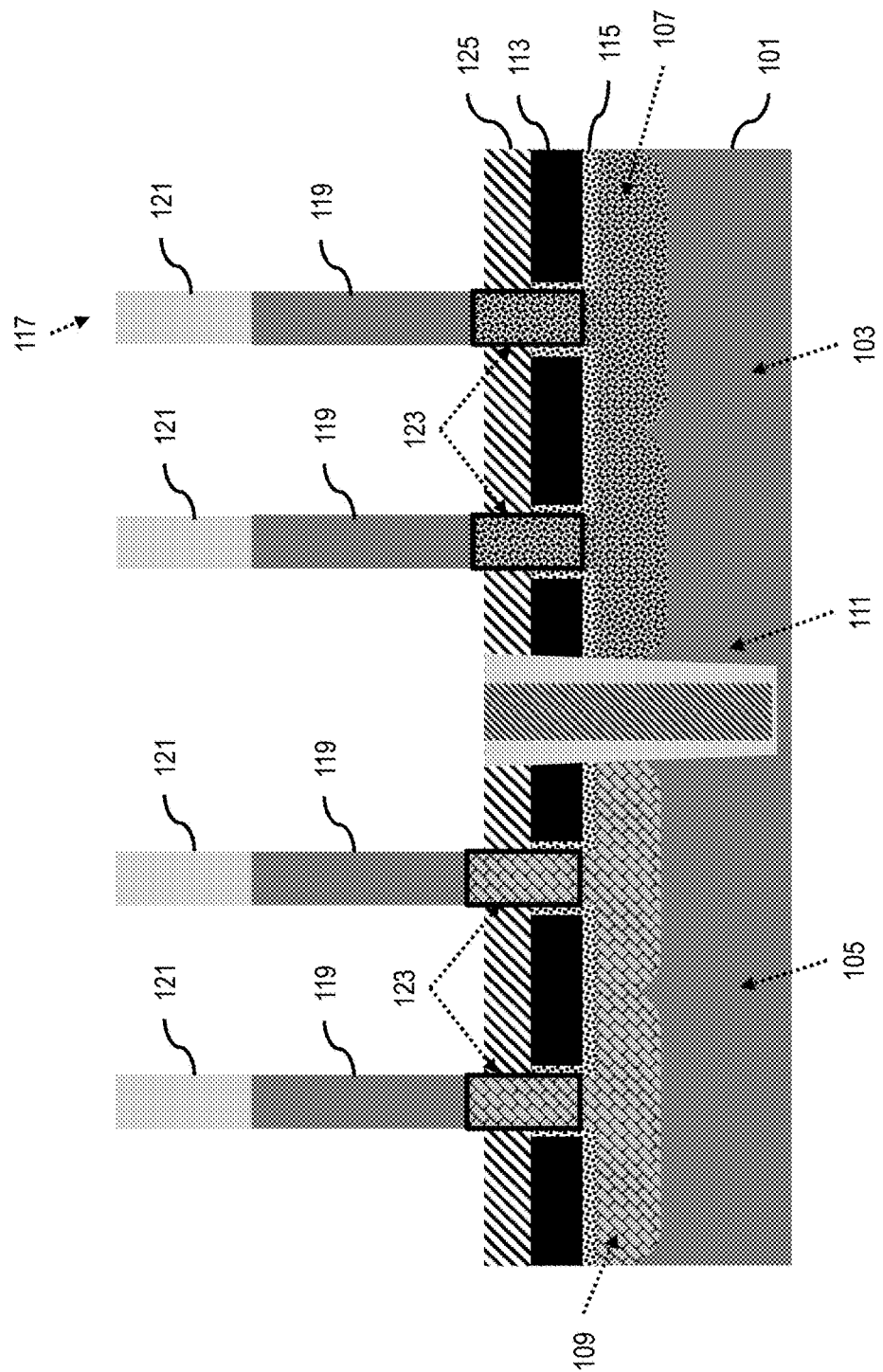
FIGS. 1A through 1K illustrate cross-sectional views of a process flow for forming self-aligned gate-first VFETs, in accordance with an exemplary embodiment.

FIG. 1A illustrates a substrate 101 including adjacent transistor regions 103 (e.g. p-type) and 105 (n-type), well areas 107 (e.g. p-well) and 109 (e.g. n-well) in the transistor regions 103/105, which are separated from each other by a shallow trench isolation (STI) region 111. Bottom S/D contacts (e.g., tungsten (W), titanium-nitride (TiN)) 113 are formed in the well areas 107 and 109 and interact through a conductive layer (e.g. tungsten-silicide (WSix)) 115. Adjacent fin structures 117, spaced from each other and each including a fin 119 (e.g. silicon (Si) channel area) and a hardmask (e.g. silicon-nitride (SiN)) 121 over the fin, are formed and connected to bottom S/D regions 123 in a corresponding transistor region. Low-k spacers (e.g. silicon-oxycarbonitride (SiOCN)) 125 are formed adjacent to the bottom S/D regions 123 and over the bottom S/D contacts 113.

Figure 1B:
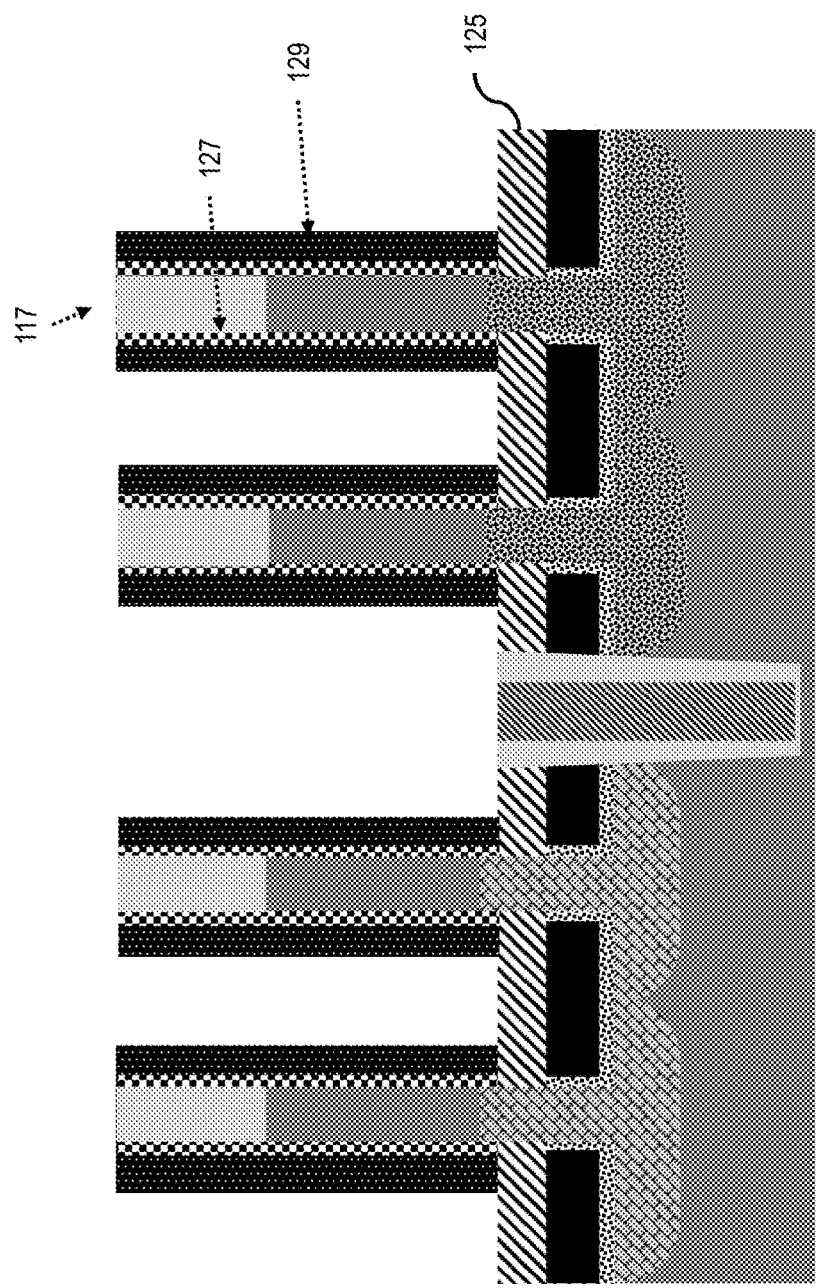

As illustrated in FIG. 1B, a gate dielectric (e.g. high-k) 127 and a metal spacer (e.g. TiN) 129 are formed consecutively on each side of each fin structure 117 (e.g. for a self-aligned gate) and over the low-k spacers 125. A chemical vapor deposition (CVD), physical vapor deposition (PVD), or atomic layer deposition (ALD) process may be utilized to form the gate dielectric or metal spacer.

Figure 1C:
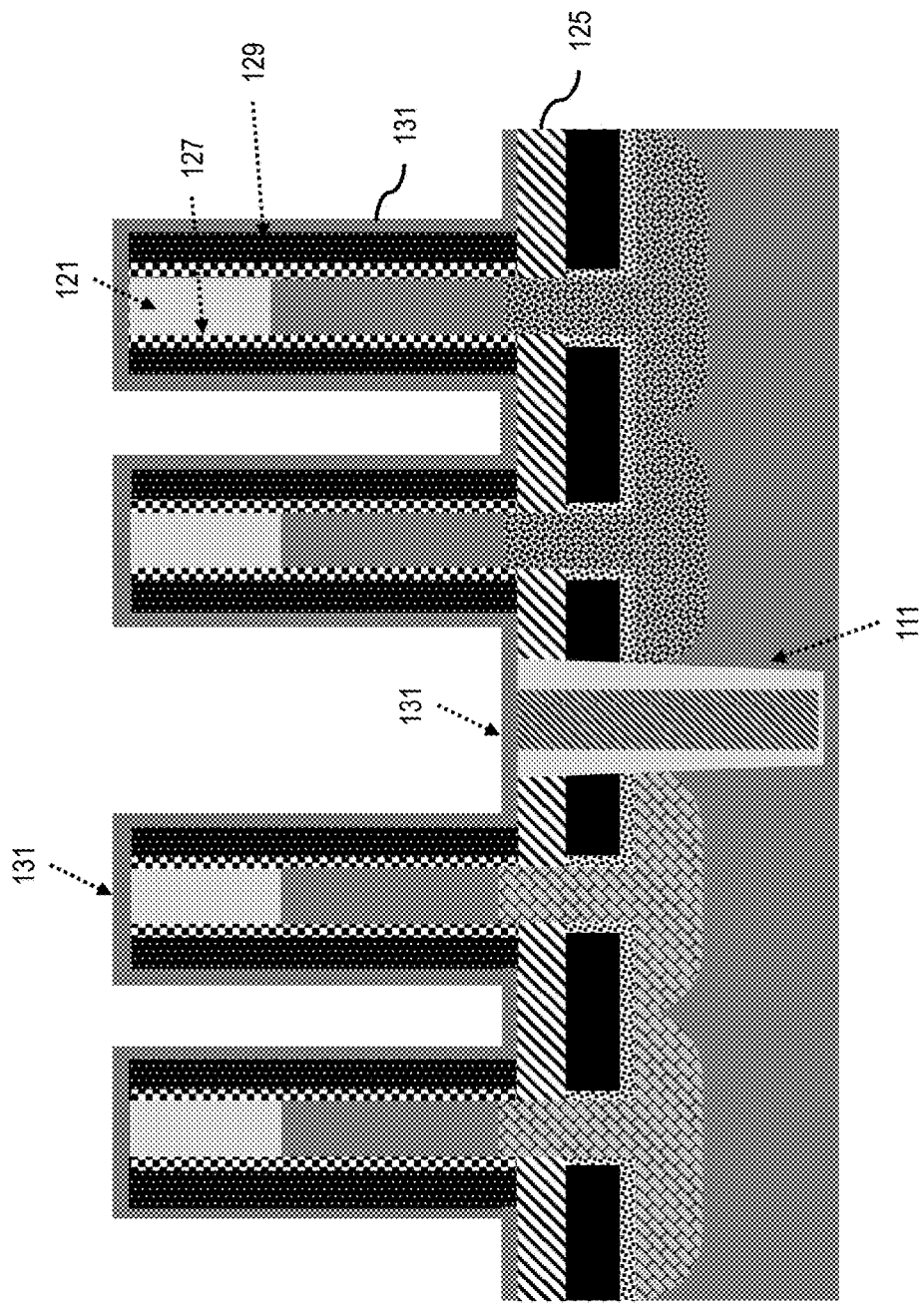

Adverting to FIG. 1C, a liner 131 is conformally formed (e.g. SiN with a thickness of 4 nm to 6 nm) on exposed surfaces of the hardmask 121, the gate dielectric 127, the metal spacer 129 of each fin structure, and the substrate including upper surfaces of the low-k spacers 125 and the STI region 111.

Figure 1D:
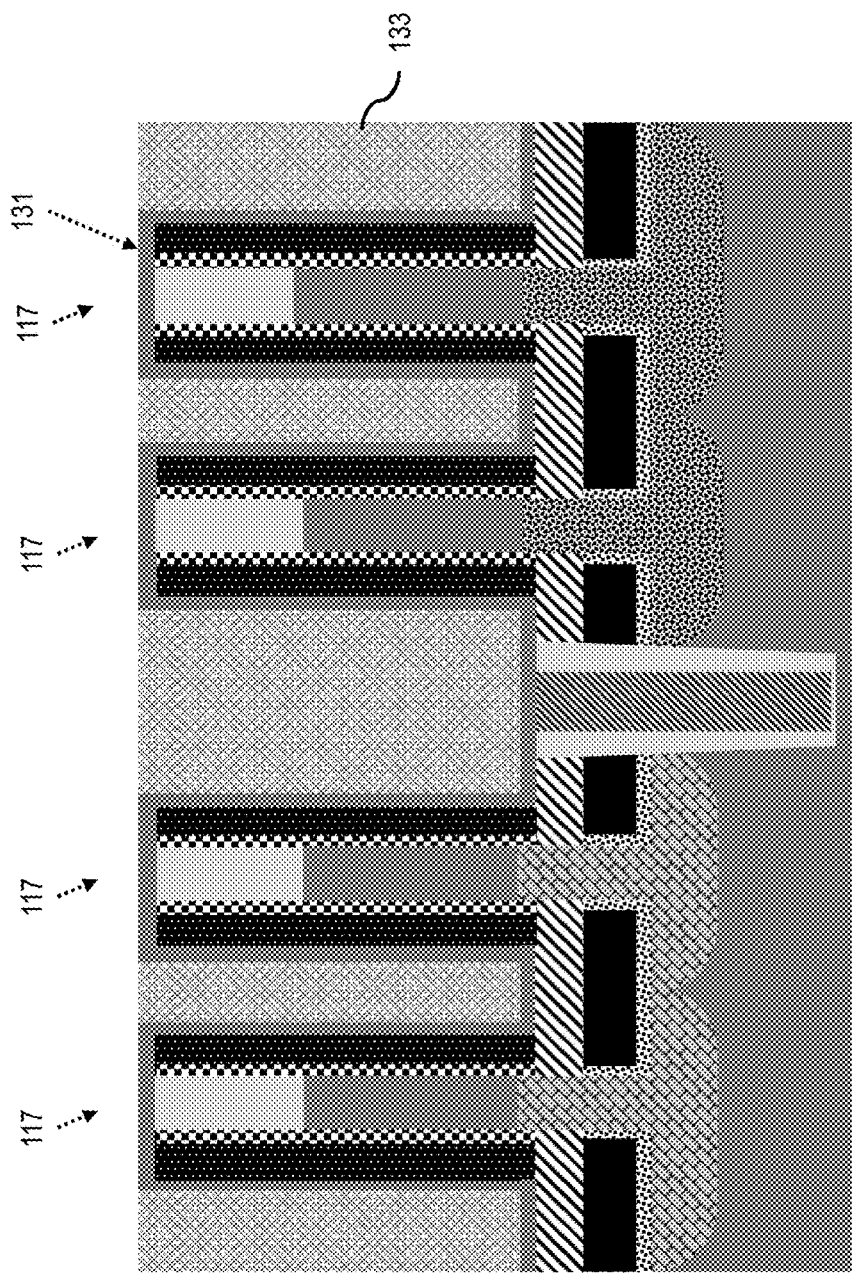

As illustrated in FIG. 1D, ILD (e.g. oxide) 133 is deposited filling spaces between the fin structures 117 and coplanar with an upper surface of the liner 131.

Figure 1E:
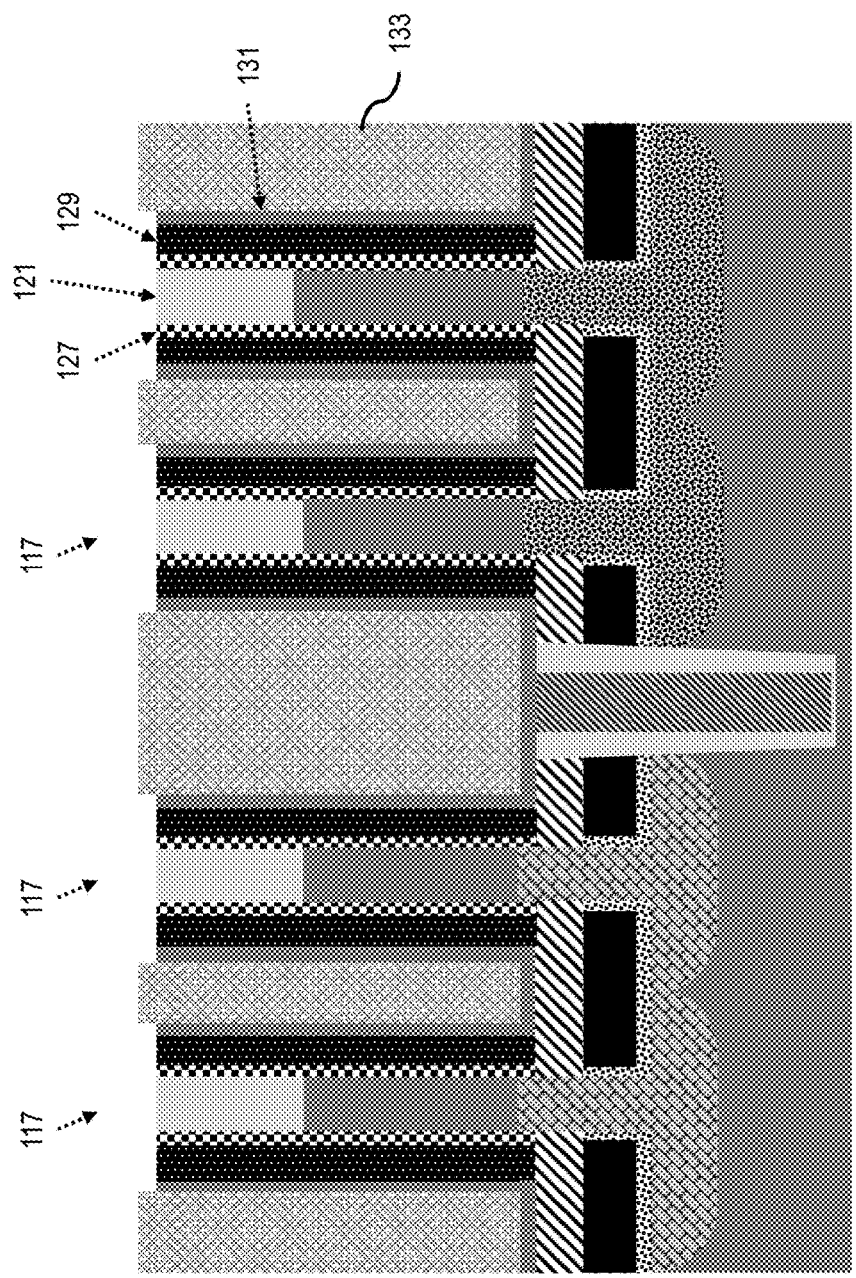

Adverting to FIG. 1E, horizontal segments of the liner 131 over the fin structures 117 is removed to expose the hardmask 121, the vertical liners 131, the gate dielectrics 127, and the metal spacers 129 of each fin structure 117.

Figure 1F:
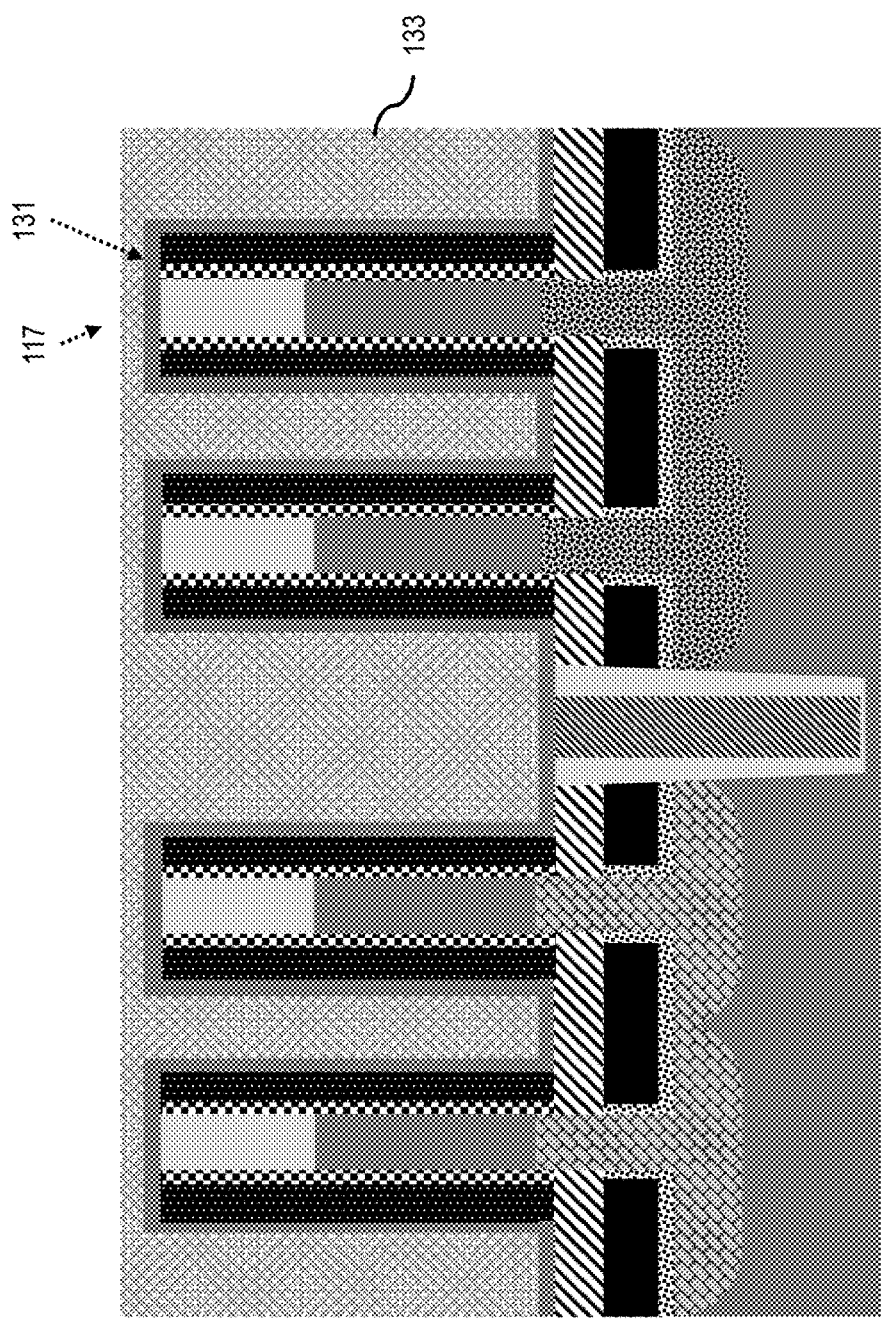
Figure 1G:
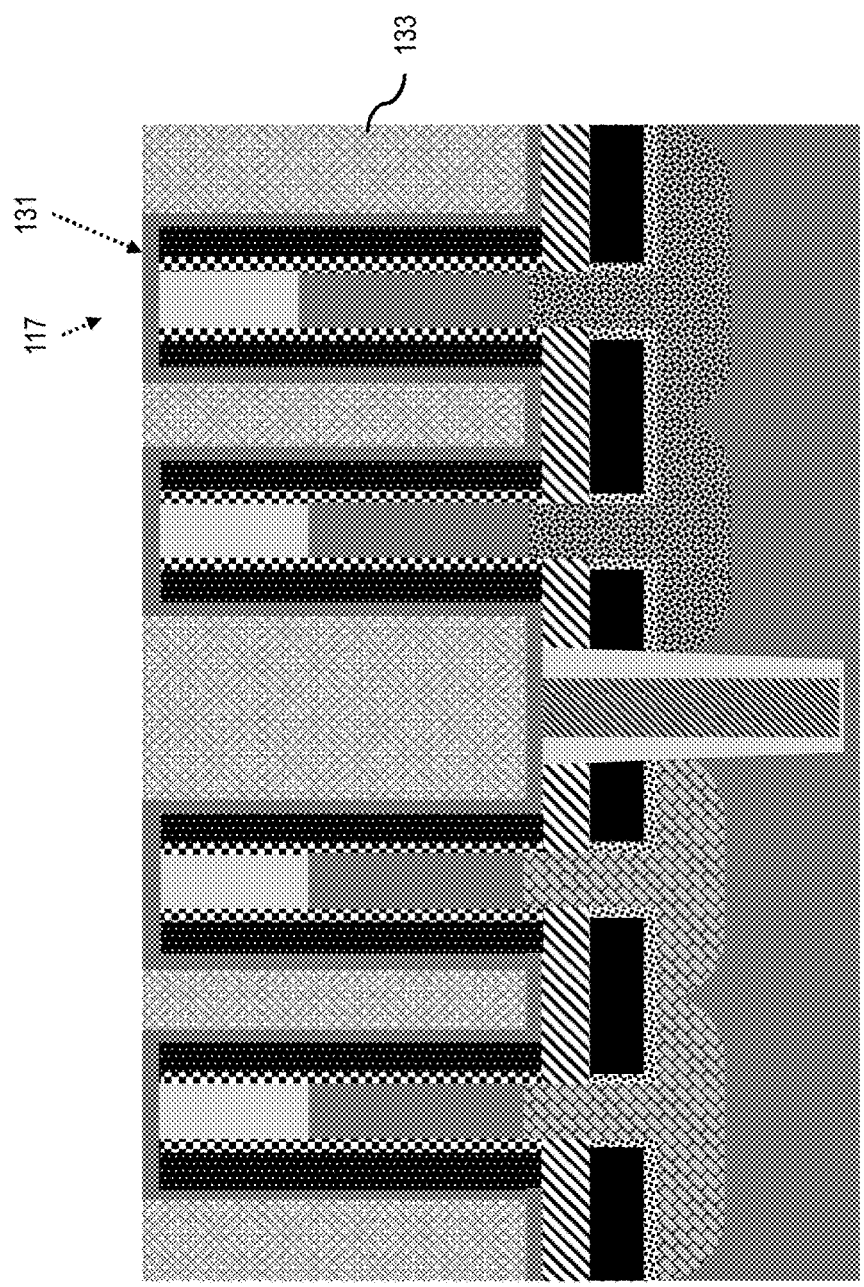

FIG. 1F illustrates an alternative scenario to FIG. 1D in which the ILD 133 not only fills the spaces between the fin structures, but also is formed over the horizontal liners 131. The ILD 133 may then be removed down to an upper surface of the liner 131, as illustrated in FIG. 1G, by chemical-mechanical-polishing (CMP), followed by removing the horizontal segments of the liner 131 over the fin structures 117, as in FIG. 1E.

Figure 1H:
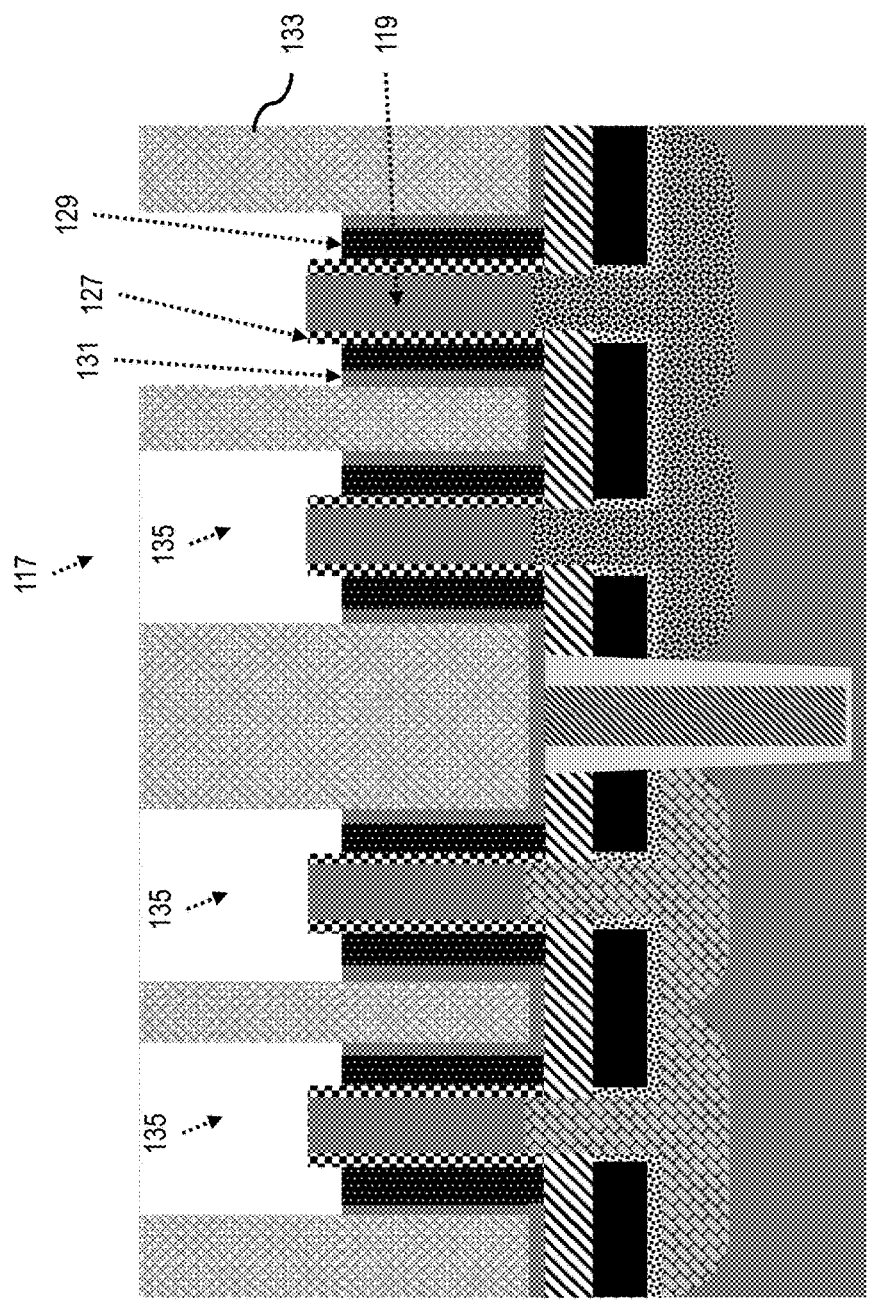

As illustrated in FIG. 1H, the hardmask 121 (of FIG. 1E) of each fin structure 117 is removed to expose an upper surface of the fin 119. Vertical sections of the liners 131, the gate dielectrics 127, and the metal spacers 129 of each fin structure 117 are recessed (e.g. by an etching process), creating cavities 135 in the ILD 133, wherein an upper surface of the liners 131 and the metal spacers 129 is lower than an upper surface of the gate dielectric 127.

Figure 1I:
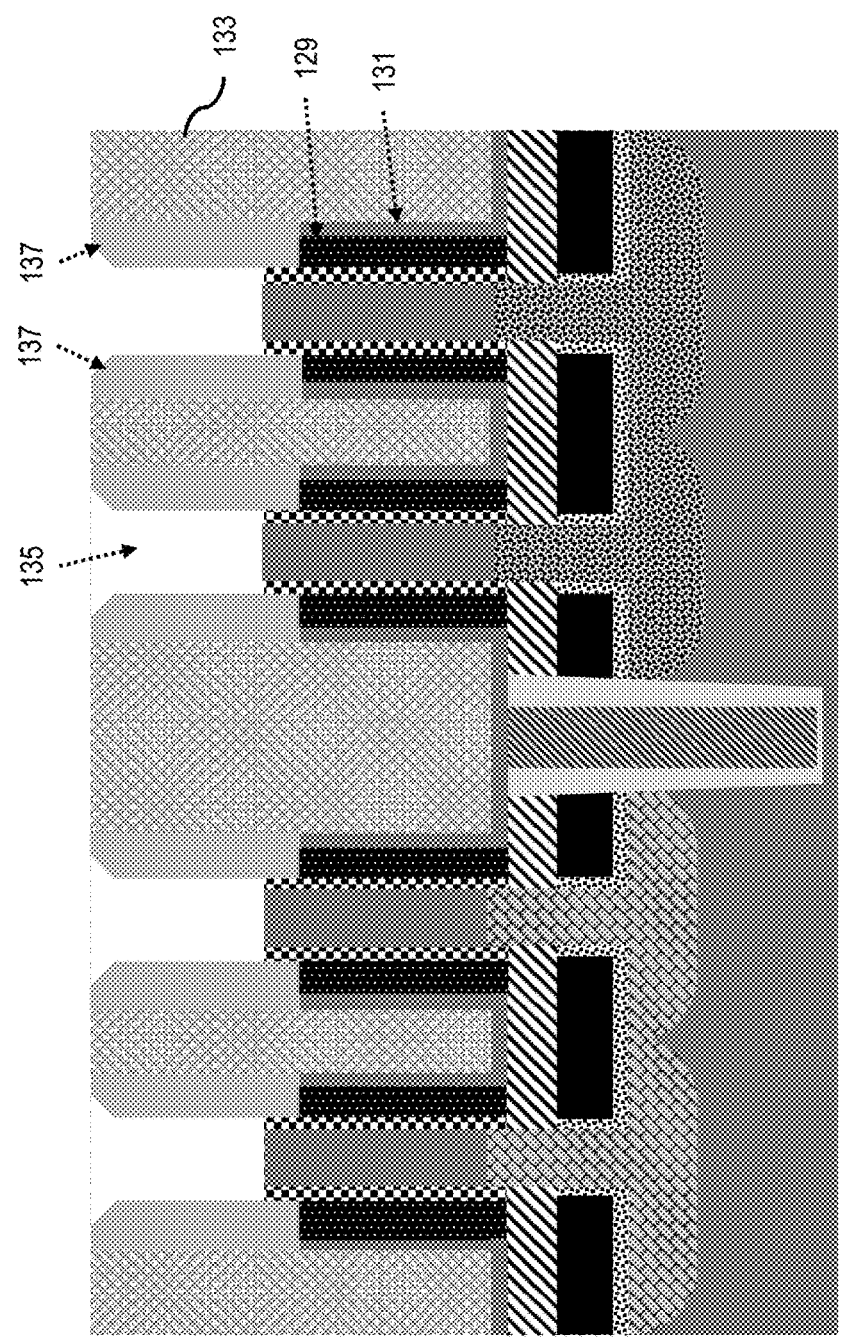

Adverting to FIG. 1I, low-k spacers (e.g. SiOCN) 137 are formed on sidewalls of each cavity 135 and over the metal spacers 129 and liners 131 in each cavity.

Figure 1J:
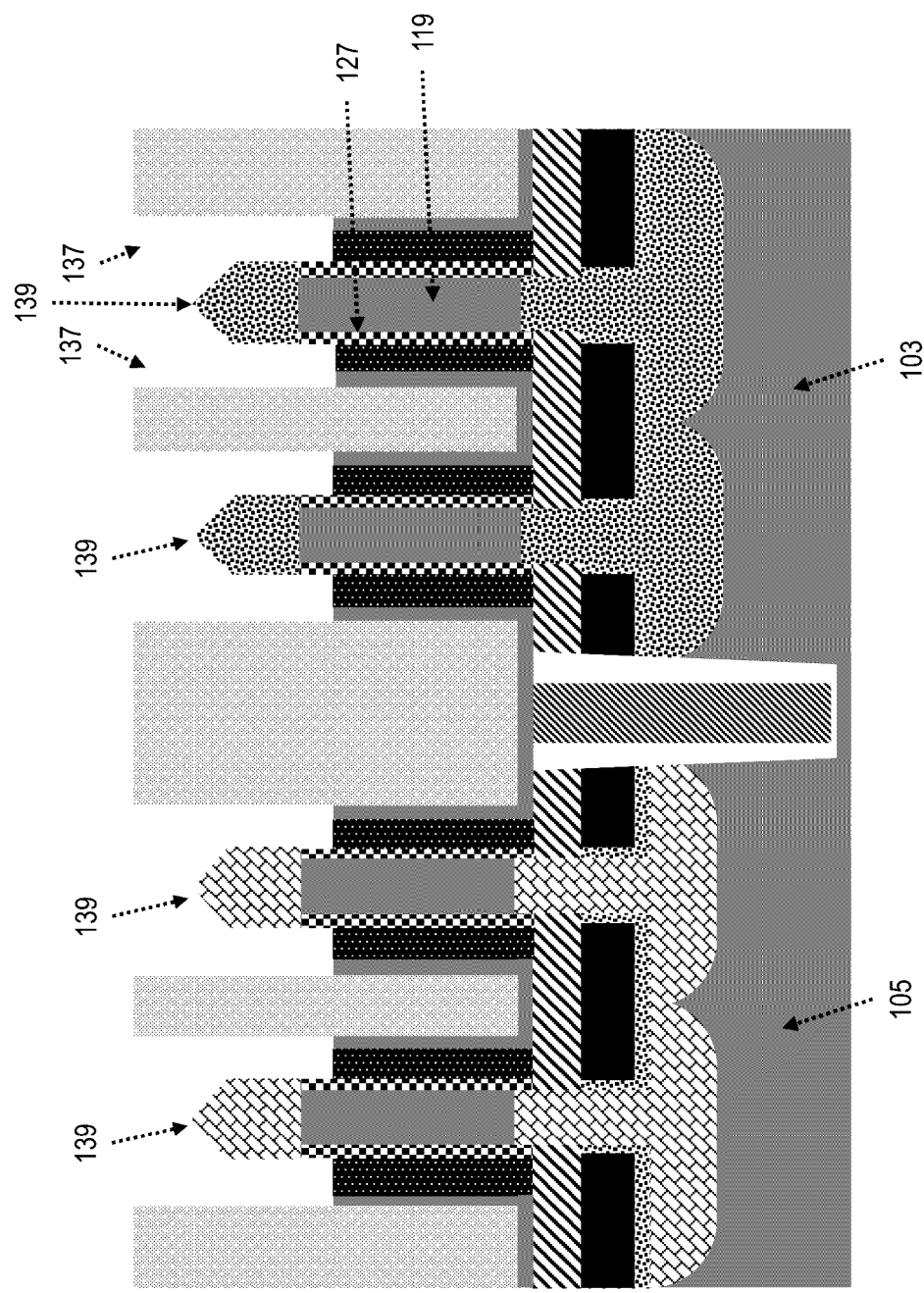
Figure 1K:
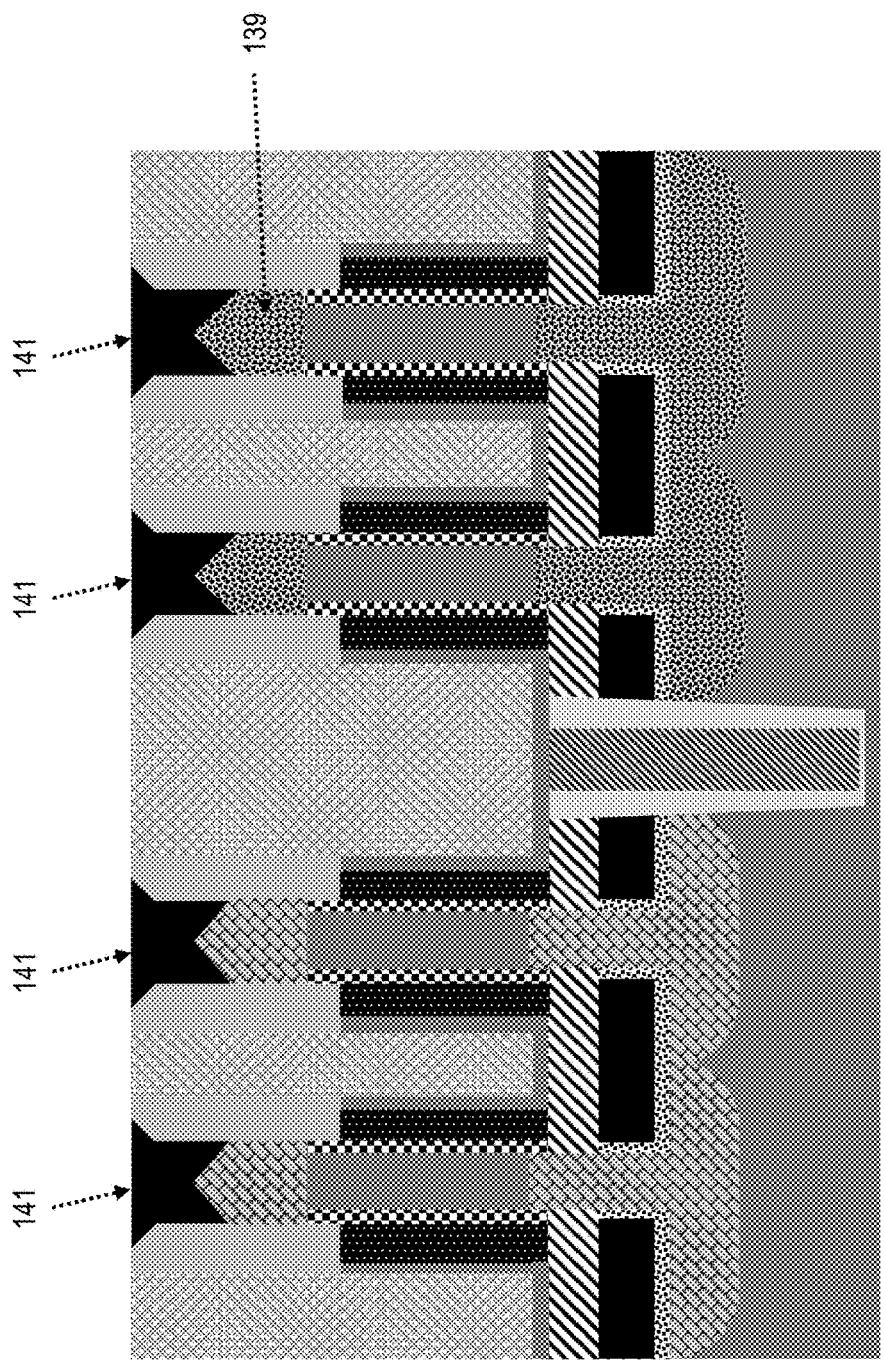

As illustrated in FIG. 1J, a top S/D structure 139 is formed, by epitaxially growing a semiconductor material (e.g., Si, silicon-germanium (SiGe)), between the low-k spacers 137, over the gate dielectric 127 and fin 119 each cavity. Each top S/D structure 139 is implanted in-situ with a dopant, or may be an already doped material, based on a type of transistor region 103/105 (e.g., p-type, n-type) associated with the corresponding fin 119. In FIG. 1K, a top S/D contact (e.g., W, TiN) 141 is formed over each top S/D structure 139.

The embodiments of the present disclosure can achieve several technical effects including reducing the number of fabrication process steps, eliminating the need for sacrificial spacers, better fabrication yields due to streamlined processes, cost reduction, and uniformity in CMP, for example, of only the ILD to reach the liner. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a substrate including adjacent transistor regions;
   forming adjacent fin structures, spaced from each other, each over a different transistor region and including a fin and a hardmask over the fin;
   forming a gate dielectric and metal spacer consecutively on each side of each fin structure;
   forming a liner on exposed surfaces of the hardmask, the gate dielectric and metal spacer of each fin structure, and the substrate;
   forming an interlayer dielectric (ILD) filling spaces between the fin structures and coplanar with an upper surface of the liner over each fin structure;
   removing the liner over the fin structures;
   removing the hardmask and recessing the liners, the gate dielectrics and metal spacers of each fin structure creating cavities in the ILD;
   forming a low-k spacer on sidewalls of and over the metal spacers and liners in each cavity;
   forming a top source/drain (S/D) structure over the gate dielectric and fin in each cavity; and
   forming a top S/D contact over each top S/D structure.

2. The method according to claim 1, comprising:
   forming each fin structure over a bottom S/D region in a corresponding transistor region.

3. The method according to claim 2, comprising:
   forming each fin in contact with the bottom S/D region of the corresponding transistor region.

4. The method according to claim 1, comprising:
   forming each top S/D structure by epitaxially growing a semiconductor material.

5. The method according to claim 1, comprising:
   implanting each top S/D structure with a dopant based on a type of transistor region associated with the corresponding fin.

6. The method according to claim 1, comprising:
   forming the liner, gate dielectric, and metal spacer on each side of each fin on low-k spacers over the transistor regions.

7. The method according to claim 1, comprising:
   forming the ILD over the liner in addition to between the fin structures; and
   removing the ILD down to an upper surface of the liner by chemical-mechanical-polishing (CMP) prior to removing the liner over the fin structures.

8. The method according to claim 1, wherein an upper surface of the liner and each metal spacer is lower than an upper surface of each gate dielectric in each cavity subsequent to recessing the liner, metal spacers, and gate dielectrics.

9. A method comprising:
   providing a substrate including adjacent transistor regions;
   forming adjacent fin structures, spaced from each other, each over a bottom S/D region in a different transistor region and including a fin and a hardmask over the fin, wherein each fin is in contact with the bottom S/D region of the corresponding transistor region;
   forming a gate dielectric and metal spacer consecutively on each side of each fin structure;
   forming a liner on exposed surfaces of the hardmask, the gate dielectric and metal spacer of each fin structure, and the substrate;
   forming an interlayer dielectric (ILD) filling spaces between the fin structures and coplanar with an upper surface of the liner;
   removing the liner over the fin structures;
   removing the hardmask and recessing the liners, the gate dielectrics and metal spacers of each fin structure creating cavities in the ILD;
   forming a low-k spacer on sidewalls of and over the metal spacers and liners in each cavity;
   forming a top source/drain (S/D) structure, by epitaxially growing a semiconductor material, over the gate dielectric and fin in each cavity; and
   forming a top S/D contact over each top S/D structure.

10. The method according to claim 9, comprising:
    implanting each top S/D structure with a dopant based on a type of transistor region associated with the corresponding fin.

11. The method according to claim 9, comprising:
    forming the liner, gate dielectric, and metal spacer on each side of each fin on low-k spacers over the transistor regions.

12. The method according to claim 9, comprising:
    forming the ILD over the liner in addition to between the fin structures; and
    removing the ILD down to an upper surface of the liner by chemical-mechanical-polishing (CMP) prior to removing the liner over the fin structures.

13. The method according to claim 9, wherein an upper surface of the liner and each metal spacer is lower than an upper surface of each gate dielectric in each cavity subsequent to recessing the liner, metal spacers, and gate dielectrics.

* * * * *